United States Patent [19]
Dagostino et al.

[11] Patent Number: 5,418,470
[45] Date of Patent: May 23, 1995

[54] ANALOG MULTI-CHANNEL PROBE SYSTEM

[75] Inventors: Thomas P. Dagostino, Beaverton; Arnold M. Frisch, Portland, both of Oreg.

[73] Assignee: Tektronix, Inc., Wilsonville, Oreg.

[21] Appl. No.: 139,651

[22] Filed: Oct. 22, 1993

[51] Int. Cl.⁶ ............................................. G01R 31/28
[52] U.S. Cl. .................................. 324/763; 324/158.1; 371/22.5
[58] Field of Search ............. 324/158 F, 158 R, 73.1, 324/763, 158.1; 371/22.3, 22.5, 22.6

[56] References Cited

U.S. PATENT DOCUMENTS

| | | | |
|---|---|---|---|
| 3,961,254 | 6/1976 | Cavaliere et al. | 371/22.3 |
| 4,357,703 | 11/1982 | Van Brunt | 371/22.5 |
| 4,931,722 | 6/1990 | Stoica | 371/22.5 |
| 4,961,053 | 10/1990 | Krug | 324/73.1 |
| 5,053,700 | 10/1991 | Parrish | 371/22.6 |
| 5,254,940 | 10/1993 | Oke et al. | 371/22.5 |
| 5,260,949 | 11/1993 | Hashizume et al. | 371/22.3 |
| 5,315,241 | 5/1994 | Ewers | 324/73.1 |

*Primary Examiner*—Ernest F. Karlsen
*Attorney, Agent, or Firm*—Francis I. Gray; John Smith-Hill

[57] ABSTRACT

A programmable analog multi-channel probe system is embedded within a device under test for coupling test points to external measurement points of the device under test. Programmable input buffer amplifiers are coupled to the test points to couple the data at those points to their outputs when enabled. The data from the input buffer amplifiers are input to respective routers to provide a plurality of outputs. Each common output from the routers is coupled as an input to an output buffer amplifier that provides the data as an output when enabled. The data at the output of the output buffer amplifiers is converted to a differential signal for transmission to the external measurement point by differential input/output amplifiers that have a reference level, selected from a plurality of reference levels including an internal reference level, as an input for comparison with the data from the output buffer amplifiers. A termination circuit may be provided for each output to provide appropriate impedance interface with the measurement points.

14 Claims, 2 Drawing Sheets

ANALOG MULTI-CHANNEL PROBE SYSTEM

BACKGROUND OF THE INVENTION

The present invention relates to analog probe systems, and more particularly to an analog multi-channel probe system for embedment into a device under test (DUT) that provides for high speed analog and digital signals to be routed to points where they may be measured by conventional methods.

There exist today several integrated circuits that are controlled by a standard IEEE 1149.1 boundary scan interface. Current boundary scan based methods of testing integrated circuits work well where the integrated circuits to be tested are static and digital, but fall short when at-speed or analog testing is required. Optimum solutions to these problems would be to embed an "oscilloscope-on-a-chip" and a "VLSI-tester-on-a-chip" into the integrated circuit or system to be tested (DUT). Unfortunately such chips presently do not have the price/performance levels required to make them practical for most applications. Also many potential test points are externally inaccessible due to the spacing of leads on integrated circuits, the density of parts on a printed circuit board, or the burying of such points within a multi-layer multi-chip module or printed circuit board. Therefore testing with conventional instruments and automated test equipment (ATE) is possible only at interfaces where the circuit or board connections are accessible.

What is needed is an analog multi-channel probe system for providing data from inaccessible test points to points that are accessible for measurement by conventional test and measurement instruments.

SUMMARY OF THE INVENTION

Accordingly the present invention provides an analog multi-channel test probe system for embedment in a device to be tested. A plurality of input points are coupled via multiplexers input buffer amplifiers to respective analog multiplexers. The outputs from the analog multiplexers are input to output buffer amplifiers such that up to m of n input points may be connected to any of m output points. The m outputs are input to respective differential input/output amplifiers where they are compared to a reference signal and produce differential outputs. An analog multiplexer has as inputs desired reference voltage levels and an input from an uncommitted input buffer amplifier. One of these inputs to the analog multiplexer is selected as the reference signal. A programmable fifty ohm termination is provided for the differential outputs if desired.

The objects, advantages and other novel features of the present invention are apparent from the following detailed description when read in conjunction with the appended claims and attached drawing.

BRIEF DESCRIPTION OF THE DRAWING

The FIGURE is a block diagram of an analog multi-channel probe system according to the present invention.

DESCRIPTION OF THE PREFERRED EMBODIMENT

Figure 1A:
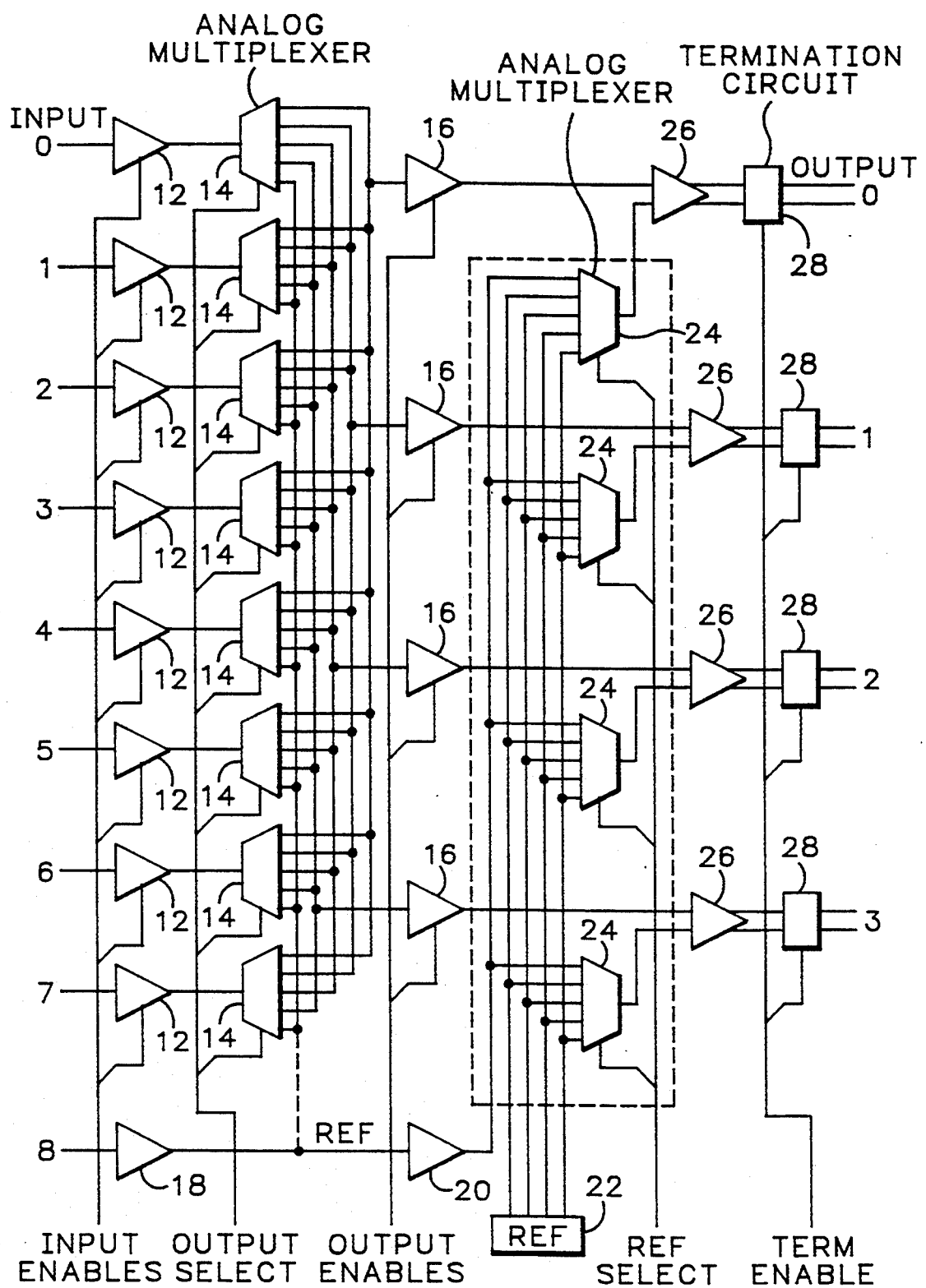
Figure 1B:
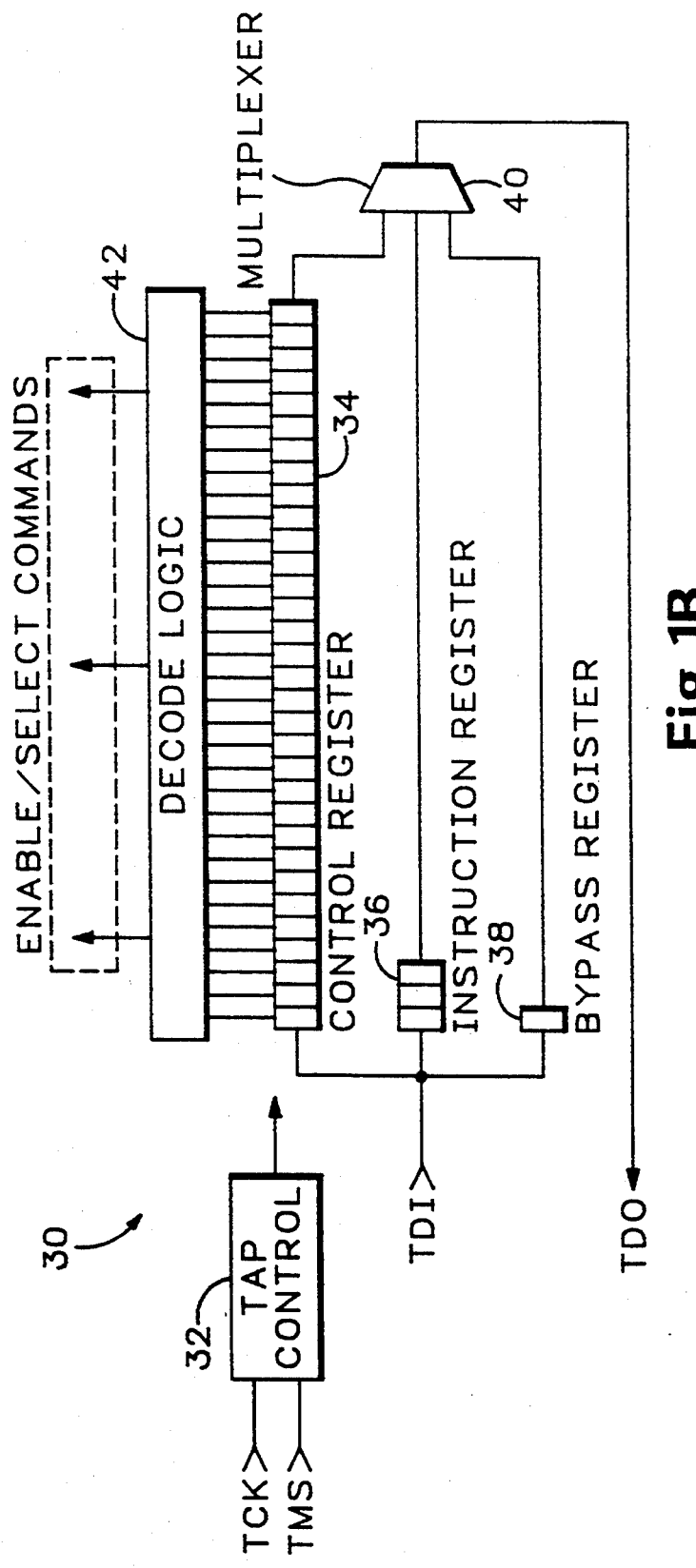

Referring now to the FIGURE, the illustrated analog multi-channel probe system has eight test inputs and four measurement outputs. Eight input signals INPUT 0–7 from test points of a device under test are input to respective input buffer amplifiers 12 via the eight inputs respectively of the probe system. Each input buffer amplifier 12 may be selectively enabled by an appropriate input enable signal. The input buffer amplifiers 12 provide high impedance and low capacitance to the input signals to allow minimum loading on the signal being measured, and convert the voltage at the input to a current at the output. The output from each input buffer amplifier 12 is input to respective analog multiplexers 14. The analog multiplexers 14 each have five outputs (one more than the number of measurement outputs of the probe system). The particular output line from any of the multiplexers 14 on which the signal at the input appears is determined by a select command for each multiplexer. Four of the outputs from the analog multiplexers 14 are input to respective programmable output buffer amplifiers 16. The extra output from each multiplexer 14 is for an uncommitted probe as a reference circuit. The multiplexers 14 steer the input currents to the desired outputs. Each output buffer amplifier 16 may be selectively enabled by an appropriate output enable signal, and converts the current at the input to a voltage at the output. In this manner between zero and four of the input signals INPUT 0–7 may be routed to between zero and four of the output buffer amplifiers 16, i.e., OUTPUT 0–3 as shown.

The remaining circuitry is for converting the single-ended output signal into a differential output signal. A reference input signal REF from the device under test is applied to an uncommitted input buffer amplifier 18 and an uncommitted output buffer amplifier 20 coupled in series. The reference input signal REF may be selected alternatively from among any of the input signals INPUT 0–7 by coupling the extra output from the multiplexers 14 to the uncommitted output amplifier 20. A reference source 22 provides many voltage references, such as ECL+, ECL−, TTL and GND. The voltage references and the reference input signal REF are applied as inputs to analog routing switches (or analog multiplexers) 24 the outputs of which are input to respective differential input/output amplifiers 26. A reference select signal is applied to the analog routing switches 24 to determine which reference levels are output. The output signals from the output buffer amplifiers 16 are applied as the other inputs to the differential input/output amplifiers 26. The multiple routing switches 24 may be replaced with a single routing switch having its output applied in parallel to all of the differential input/output amplifiers 26. In this way only a single reference level is selected which is applied to all of the differential input/output amplifiers 26. Differential output signals minimize the effects of local crosstalk and noise sources as they travel to a measurement point. The differential output signals from the differential input/output amplifiers 26 are input to respective selectable termination circuits 28, such as 50 ohm circuits, to provide appropriate connections for conventional test and measurement instruments at the measurement points. A termination enable signal determines whether the particular differential output signal is terminated or passed straight through to the differential output terminals. Thus the input signals may be referenced to the internally generated voltage levels or to the reference signal REF from the DUT.

A standard IEEE 1149.1 boundary scan interface 30, or similar program bus, is provided for programming the analog multi-channel probe system. A test access port (TAP) controller 32 provides appropriate signals from a test clock TCK and a test master signal TMS. Test input data TDI is loaded serially into a control register 34, an instruction register 36 and a bypass register 38. A test data output multiplexer 40 is coupled to have as inputs the outputs from the control register 34, the instruction register 36 and the bypass register 38 to provide test output data TDO back to the boundary scan interface. A decoder logic circuit 42 converts the contents of the control register 34 into respective enable/select signals for the input and output buffer amplifiers 12, 16, the routers and routing switches 14, 24, and the termination circuits 28.

Thus the present invention provides a programmable analog multi-channel probe system for embedment into a device under test, such as a printed circuit board, integrated circuit or multi-chip module, that couples any test point of the device under test to an external measurement point where conventional instrumentation may be used to measure the voltage(s) at the selected test point(s).

What is claimed is:

1. An analog multi-channel probe system comprising:
   n input buffer amplifiers, where n is a positive integer, each input buffer amplifier having an input coupled to a test point of a device under test, an output and a control terminal by which the input buffer amplifier can be selectively enabled, whereby when the input buffer amplifier is enabled it provides a test signal at its output;
   a test signal selector means comprising n analog multiplexers, one analog multiplexer for each input buffer amplifier with each analog multiplexer having an input coupled to a separate one of the input buffer amplifier outputs, m outputs, where m is a positive integer, and a control terminal by which the multiplexer input can be selectively coupled to any one of its m outputs, the test signal selector means having m selector outputs and the ith output (i=1 ... m) of each multiplexer being coupled to the ith selector output; and
   m output buffer amplifiers, each output buffer amplifier having an input coupled to a separate one of the m selector outputs, an output coupled to an external measurement point and a control terminal by which the output buffer amplifier can be selectively enabled so that any test point may be coupled to any external measurement point as determined by control commands applied to the control terminals of the input and output buffer amplifiers and the analog multiplexers.

2. The probe system as recited in claim 1 further comprising means for converting the outputs from the output buffer amplifiers to differential outputs with respect to a selected one of a plurality of reference levels.

3. The probe system as recited in claim 2 further comprising means for selectively providing a desired termination for the differential outputs.

4. The probe system as recited in claim 2 wherein the converting means comprises:
   means for selecting as an output one of a plurality of reference levels;
   means for generating the plurality of reference levels; and
   means for producing the differential outputs from the outputs of the output buffer amplifiers as a function of the selected reference level.

5. The probe system as recited in claim 4 wherein the converting means further comprises means for deriving from the device under test a reference signal as another input to the selecting means so that the output of the selecting means is selected from among the reference levels and the reference signal.

6. The probe system as recited in claim 2 wherein the converting means comprises:
   means for deriving from the device under test a reference level; and
   means for producing the differential outputs from the outputs of the output buffer amplifiers as a function of the reference level.

7. The probe system as recited in claim 1 further comprising means for programming appropriate commands for application to each control terminal so that specified test points may be coupled to specified external measurement points.

8. The probe system as recited in claim 1 further comprising means for converting the outputs from the output buffer amplifiers to differential outputs in response to a level signal.

9. The probe system as recited in claim 8 wherein the converting means comprises a plurality of differential input/output amplifiers, each differential input/output amplifier having a separate one of the outputs from the output buffer amplifiers as a first input and the level signal as a second input and having a pair of output terminals to provide a differential output.

10. The probe system as recited in claim 8 wherein the converting means comprises:
    means for selecting a reference level from among a plurality of input reference levels as the level signal; and
    means for generating from the selected reference level and the outputs from the output buffer amplifiers the differential outputs.

11. The probe system as recited in claim 1, further comprising means for generating a plurality of reference levels, means for selecting one of the reference levels, and means for converting the outputs from the output buffer amplifiers to differential outputs as a function of the selected reference level.

12. The probe system as recited in claim 1, further comprising means for deriving a first reference level from the device under test, means for generating at least a second reference level externally of the device under test, means for selecting one of the reference levels, and means for converting the outputs from the output buffer amplifiers to differential outputs as a function of the selected reference level.

13. An analog multi-channel probe system comprising:
    n input buffer amplifiers, where n is a positive integer, each input buffer amplifier having an input coupled to a test point of a device under test, an output and a control terminal by which the input buffer amplifier can be selectively enabled, whereby when the input buffer amplifier is enabled it provides a test signal at its output;
    a test signal selector means comprising n analog multiplexers, one analog multiplexer for each input buffer amplifier with each analog multiplexer having an input coupled to a separate one of the input buffer amplifier outputs, m+1 outputs, where m is a positive integer, and a control terminal by which the multiplexer input can be selectively coupled to any one of its m+1 outputs, the test signal selector means having m+1 selector outputs and the ith output (i=1 ... m+1) of each multiplexer being coupled to the ith selector output;

m output buffer amplifiers, each output buffer amplifier having an input coupled to a separate one of the m selector outputs, an output coupled to an external measurement point and a control terminal by which the output buffer amplifier can be selectively enabled so that any test point may be coupled to any external measurement point as determined by control commands applied to the control terminals of the input and output buffer amplifiers and the analog multiplexers;

an additional output amplifier coupled to the (m+1)th selector output for providing a reference level; and means for converting an output signal provided by an output buffer amplifier to a differential output signal as a function of the reference level.

14. The probe system as recited in claim 13, further comprising means for providing a desired termination for the differential output signal.

* * * * *